(12) United States Patent
Chen et al.

(10) Patent No.: US 11,881,333 B1
(45) Date of Patent: Jan. 23, 2024

(54) GROUND TERMINAL AND ELECTRONIC DEVICE

(71) Applicant: Shenzhen Johan Material Technology Co., Ltd., Guangdong (CN)

(72) Inventors: Mujiu Chen, Guangdong (CN); Jingyun Liu, Guangdong (CN); Qiao Chen, Guangdong (CN)

(73) Assignee: Shenzhen Johan Material Technology Co., Ltd., Shenzhen (CN)

( * ) Notice: Subject to any disclaimer, the term of this patent is extended or adjusted under 35 U.S.C. 154(b) by 0 days.

(21) Appl. No.: 18/199,979

(22) Filed: May 22, 2023

(30) Foreign Application Priority Data

Dec. 6, 2022 (CN) .......................... 202211552991.5

(51) Int. Cl.
| | |
|---|---|
| *H05K 1/11* | (2006.01) |
| *H05K 1/02* | (2006.01) |
| *H01B 5/14* | (2006.01) |
| *H05K 1/14* | (2006.01) |
| *H05K 1/18* | (2006.01) |

(52) U.S. Cl.
CPC .............. *H01B 5/14* (2013.01); *H05K 1/11* (2013.01); *H05K 1/0251* (2013.01); *H05K 1/111* (2013.01); *H05K 1/14* (2013.01); *H05K 1/18* (2013.01); *H05K 2201/0379* (2013.01)

(58) Field of Classification Search
CPC ..... H01B 5/14; H05K 1/11; H05K 2201/0379
See application file for complete search history.

(56) References Cited

U.S. PATENT DOCUMENTS

2005/0258550 A1  11/2005 Morita et al.

FOREIGN PATENT DOCUMENTS

| CN | 209785570 U | 12/2019 |
|---|---|---|
| CN | 112310671 A | 2/2021 |
| CN | 112993606 A | 6/2021 |
| CN | 113923853 A | 1/2022 |
| CN | 113993362 A | 1/2022 |
| GB | 1407533 A | 9/1975 |
| KR | 20170049239 A | 5/2017 |
| WO | 2010134734 A2 | 11/2010 |

OTHER PUBLICATIONS

Notice of Allowance of counterpart Chinese Patent Application No. 202211552991.5 dated Jan. 13, 2023.

*Primary Examiner* — Ishwarbhai B Patel

(57) ABSTRACT

Disclosed are a ground terminal and an electronic device. The ground terminal includes a core body, a first bonding layer, a second bonding layer, a metal support plate, a third bonding layer, a fourth bonding layer, and a metal work piece. The metal support plate is attached to a lower part of the core body. The metal work piece includes a contact layer, a side layer, an upper welding layer, a wrapping layer, and a lower welding layer. The contact layer is attached to an upper part of the core body, the side layer is located on one side of the core body, the upper welding layer is connected to the metal support plate, the wrapping layer wraps an end portion of the metal support plate, the upper and lower welding layers are connected to a top end of the wrapping layer and the metal support plate, respectively.

20 Claims, 4 Drawing Sheets

GROUND TERMINAL AND ELECTRONIC DEVICE

CROSS REFERENCE TO RELATED APPLICATIONS

The present application claims the benefit of Chinese Patent Application No. 202211552991.5 filed on Dec. 6, 2022, the contents of which are incorporated herein by reference in their entirety.

TECHNICAL FIELD

The present disclosure relates to the technical field of precision electronics, and in particular, to a ground terminal and an electronic device

BACKGROUND

In a communication apparatus, for example, in a smartphone or a tablet computer, in order to prevent signal interference or eliminate static electricity, two to-be-grounded interfaces are often electrically connected by using a ground terminal or a welding elastic gasket. The electrical connection should be as stable as possible. Batch-to-batch consistency is also important, particularly in a grounding region of a radio frequency (RF) antenna.

For the two to-be-grounded interfaces, the ground terminal is usually welded on a circuit board of one interface, and an ultrasonic or laser welding technology using metal layer overlaying has emerged. For example, the Chinese patent with Publication Number of CN112993606A discloses an electronic device and a method for preparing an elastic grounding assembly. In the patent, two metal layers are bonded by using an ultra-thin adhesive layer, and then the bonded metal is welded. However, the bonding by using the adhesive layer before the welding is very fragile. During production or use, there is a risk of misalignment or layering of the two metal layers due to an external force, such as cutting or transportation vibration. As a result, a short circuit occurs or a specified working range is exceeded due to shift of an upper support layer. In addition, during the welding, a bonding part of tails of the two metal layers may be warped and comes into contact with a higher-height component, causing an unexpected short circuit.

For another example, the Chinese patent with Publication Number of CN112310671A discloses a high-temperature resistant ground elastic member and an electronic device. In the patent, although a polyimide (PI) film is added between two metal layers, namely, a first connection section and a fixed section, and then the two metal layers which are overlaid are welded, it is still impossible to avoid misalignment and warping of an upper metal layer and a lower metal layer during ultrasonic welding. In addition, if laser welding is adopted, it is easy to cause a focus to the PI film due to high temperature, affecting conductivity of a molten pool.

SUMMARY

A technical problem to be solved in the present disclosure is that two metal layers are easily warped and misaligned when a ground terminal with two overlaid metal layers is welded.

In order to solve the above technical problem, the present disclosure provides a ground terminal, including a core body, a first bonding layer, a second bonding layer, a metal support layer, a third bonding layer, a fourth bonding layer, and a metal work piece, where the first bonding layer is attached to an upper surface of the core body; the second bonding layer is attached to a lower surface of the core body; the metal support plate is located below the core body and attached to the second bonding layer; the third bonding layer is attached to an upper surface of the metal support plate; the fourth bonding layer is attached to a lower surface of the metal support plate; and the metal work piece includes a contact layer, a side layer, an upper welding layer, a wrapping layer, and a lower welding layer, where the contact layer is attached to an upper surface of the first bonding layer, the side layer is located on one side of the core body and extends downwards from one end of the contact layer, the upper welding layer is connected to the metal support plate through the third bonding layer, and extends from a bottom end of the side layer to one end of the metal support plate along a surface of the metal support plate, the wrapping layer wraps an end portion of the metal support plate, the upper welding layer is connected to a top end of the wrapping layer, the lower welding layer extends from a bottom end of the wrapping layer to the core body along the surface of the metal support plate, and the lower welding layer is connected to the metal support plate through the fourth bonding layer.

Further, there are two side layers, two upper welding layers, two wrapping layers, and two lower welding layers, and the two side layers, the two upper welding layers, the two wrapping layers, and the two lower welding layers each are left-right symmetrical with respect to a center of the core body.

Further, a surface of the core body facing away from the side layer is exposed outside the metal work piece.

The ground terminal further includes an auxiliary metal plate, where the auxiliary metal plate includes an upper auxiliary layer and a lower auxiliary layer, the upper auxiliary layer is attached to the side layer, the upper auxiliary layer extends from top to bottom, the lower auxiliary layer extends from a bottom end of the upper auxiliary layer to the wrapping layer along the surface of the metal support plate, and the lower auxiliary layer is attached to an upper surface of the upper welding layer.

Further, a surface of the auxiliary metal plate facing away from the metal work piece is nickel-plated or blackened.

Further, the auxiliary metal plate has a thickness of 6-12 µm.

The ground terminal further includes a base adhesive layer, where the base adhesive layer is attached to a bottom surface of the metal support plate.

Further, the core body includes a foam and a PI film, where the PI film wraps the foam, and the first bonding layer and the second bonding layer are attached to the PI film.

Further, the metal work piece has a thickness of 6-25 µm.

Further, the metal support plate has a thickness of 35-50 µm.

Further, the third bonding layer and the fourth bonding layer each have a thickness of 3-6 µm.

An electronic device includes a circuit board and the ground terminal, where the ground terminal is welded on a surface of the circuit board to form a molten pool, and the molten pool runs through the upper welding layer, the metal support plate, and the lower welding layer and is connected to the surface of the circuit board.

Compared with the prior art, the ground terminal and the electronic device in the embodiments of the present disclosure have following beneficial effects: The metal support plate is disposed below the core body, the end portion of the metal support plate is wrapped by using the wrapping layer, and the wrapping layer connects the upper and lower welding layers into a whole, such that a structure between a metal working layer and the metal support plate is stable. During the welding, the molten pool can be generated normally, and even after being pressed thousands of times, the metal working layer and the metal support plate are neither warped or misaligned with each other, nor fractured.

In the figures, 1: core body; 11: foam; 12: PI film; 2: first bonding layer; 3: second bonding layer; 4: metal support plate; 5: third bonding layer; 6: fourth bonding layer; 7: metal work piece; 71: contact layer; 72: side layer; 73: upper welding layer; 74: wrapping layer; 75: lower welding layer; 8: auxiliary metal plate; 81: upper auxiliary layer; 82: lower auxiliary layer; 9: base adhesive layer; 10: circuit board; 101: molten pool; 102: ground terminal.

DETAILED DESCRIPTION

The preferred embodiments of the present application will be described in detail below with reference to the accompanying drawing. It is to be understood by those skilled in the art that the descriptions are only illustrative and exemplary, and should not be construed as a limitation to the protection scope of the present disclosure.

It is to be noted that orientations such as top, bottom, upward and downward used herein are defined based on the directions in the accompanying drawings. They are relative concepts and thus can change according to different positions and different using states. These or other orientations should not be construed as limiting terms.

It is to be noted that the term "include" does not exclude other elements or steps, and the term "a" or "an" does not exclude a plural form.

In addition, it is further to be noted that, for any single technical feature described or implied in the embodiments of the present disclosure, or any single technical feature illustrated or implied in the accompanying drawings, these technical features (or equivalents thereof) can still be combined to obtain other embodiments not directly mentioned in the present disclosure.

It should be further understood that the terms such as "first", "second", and the like are used in the present disclosure to describe various information, but the information should not be limited to these terms, and these terms are only used to distinguish the same type of information from each other. For example, without departing from the scope of the present disclosure, "first" information may be referred to as "second" information, and similarly, "second" information may be referred to as "first" information.

Figure 1:
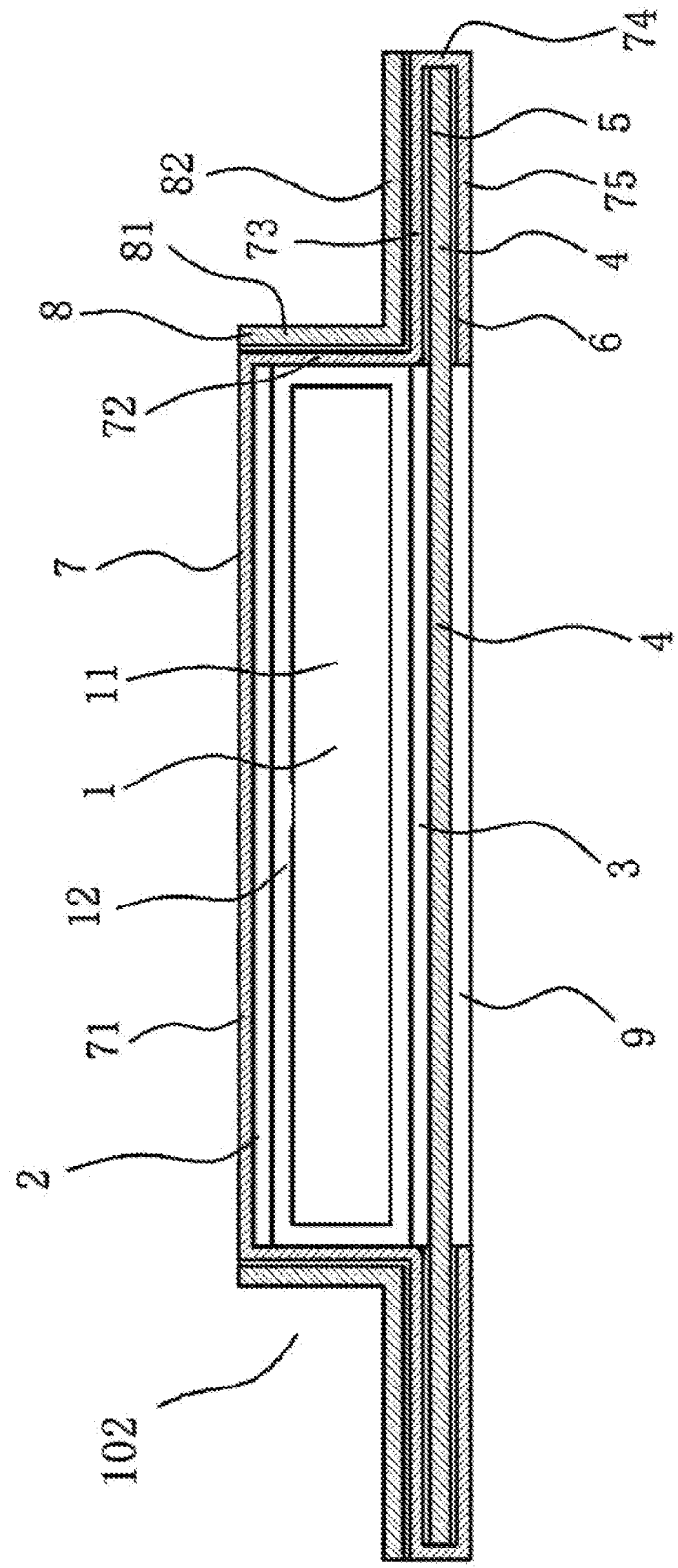
FIG. 1 is a schematic structural diagram according to an embodiment of the present disclosure.
Figure 2:
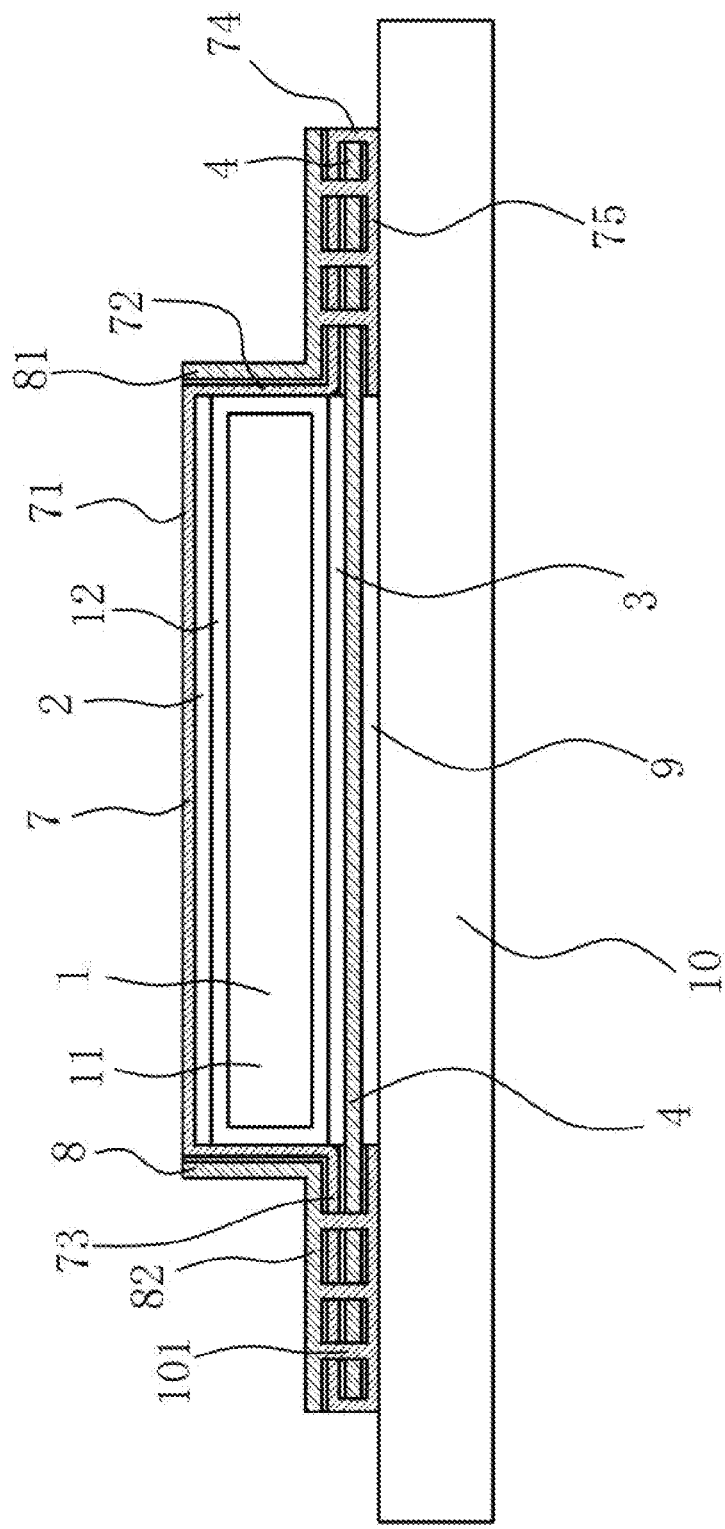
FIG. 2 is a schematic structural diagram of an electronic device according to an embodiment.

It is to be noted that the same reference numeral refers to the same or approximately the same component in different accompanying drawings, As shown in FIG. 1 and FIG. 2, a ground terminal 102 according to a preferred embodiment of the present disclosure includes a core body 1, a first bonding layer 2, a second bonding layer 3, a metal support plate 4, a third bonding layer 5, a fourth bonding layer 6, and a metal work piece 7. The core body 1 is enclosed by the metal work piece 7, and the metal work piece 7 provides conductivity for the ground terminal 102.

The core body 1 is resilient, such that the ground terminal 102 can rebound after being pressed. The first bonding layer 2 is attached to an upper surface of the core body 1, the second bonding layer 3 is attached to a lower surface of the core body 1, both the first bonding layer 2 and the second bonding layer 3 are made of pressure-sensitive adhesive, and adhesive layer thicknesses of the first bonding layer 2 and the second bonding layer 3 each are 6-30 μm. Preferably, the adhesive layer thicknesses of the first bonding layer 2 and the second bonding layer 3 each are 6-20 μm. The metal support plate 4 is located below the core body 1, and an upper surface of the metal support plate 4 is attached to a bottom surface of the second bonding layer 3. The metal work piece 7 wraps the core body 1 and the metal support plate 4, and the metal support plate 4 can support and reinforce an overall structure.

The third bonding layer 5 is attached to the upper surface of the metal support plate 4. For an actual finished product of the ground terminal 102, both the third bonding layer 5 and the second bonding layer 3 are located on the upper surface of the metal support plate 4. The third bonding layer 5 and the second bonding layer 3 may be connected or separated. The fourth bonding layer 6 is attached to a lower surface of the metal support plate 4. In this embodiment, the fourth bonding layer 6 and the third bonding layer 5 are symmetrically disposed with respect to the metal support plate 4. In other embodiments, thicknesses and materials of the fourth bonding layer 6 and the third bonding layer 5 may be different. Both the third bonding layer 5 and the fourth bonding layer 6 are made of acrylic pressure-sensitive adhesive or epoxy hot-melt adhesive.

The metal work piece 7 includes a contact layer 71, a side layer 72, an upper welding layer 73, a wrapping layer 74, and a lower welding layer 75. The contact layer 71, the side layer 72, the upper welding layer 73, the wrapping layer 74, and the lower welding layer 75 are sequentially connected, and the contact layer 71, the side layer 72, the upper welding layer 73, the wrapping layer 74, and the lower welding layer 75 are integrally formed. Thicknesses of the contact layer 71, the side layer 72, the upper welding layer 73, the wrapping layer 74, and the lower welding layer 75 are basically the same. In this embodiment, the metal work piece 7 is made of a copper foil, while in other embodiments, the metal work piece 7 may be made of an alloy metal foil.

The contact layer 71 is attached to an upper surface of the first bonding layer 2. In this embodiment, in order to ensure that the contact layer 71 is firmly fixed with the core body 1, the first bonding layer 2 covers the entire upper surface of the core body 1, thereby ensuring that there is no gap between the contact layer 71 and the upper surface of the core body 1. In this embodiment, the first bonding layer 2 is a double-sided adhesive tape made of the acrylic pressure-sensitive adhesive, which is conducive to large-scale production. When the ground terminal is prepared, a double-sided adhesive tape of a proper size can be pre-produced, and the double-sided adhesive tape can be directly attached to the upper surface of the core body 1 during assembling. In other embodiments, the first bonding layer 2 may be made of the acrylic pressure-sensitive adhesive. When the ground terminal is prepared, it is necessary to first coat adhesive on the upper surface of the core body 1. When the first bonding layer 2 is made by using adhesive, coating area of the adhesive can be adjusted in conjunction with a camera vision system to ensure that a coating range of the first bonding layer 2 matches a shape of the upper surface of the core body 1.

The side layer 72 is located on one side of the core body 1, and extends downwards from one end of the contact layer 71. In this embodiment, the side layer 72 may abut against a side surface of the core body 1, or a gap may be left between the side layer 72 and the core body 1. If the side layer 72 abuts against the side surface of the core body 1, a structure between the metal work piece 7 and the core body 1 can be more compact. If the gap is left between the side layer 72 and the core body 1, more space for expansion and contraction is available for the core body 1 when the core body 1 deforms after being pressed.

The upper welding layer 73 extends from a bottom end of the side layer 72 to one end of the metal support plate 4 along a surface of the metal support plate 4. In this embodiment, the upper welding layer 73 and the side layer 72 are formed by bending a same metal sheet. Therefore, a junction between the upper welding layer 73 and the side layer 72 has a certain radian, and there is a gap between the core body 1 and the junction between the upper welding layer 73 and the side layer 72. A bottom surface of the upper welding layer 73 is attached to an upper surface of the third bonding layer 5, and the upper welding layer 73 is fixed to the metal support plate 4 through the third bonding layer 5.

An overall shape formed by the upper welding layer 73, the wrapping layer 74, and the lower welding layer 75 are generally U-shaped. The wrapping layer 74 wraps an end portion of the metal support plate 4, and the upper welding layer 73 is connected to a top end of the wrapping layer 74. The lower welding layer 75 extends from a bottom end of the wrapping layer 74 to the core body 1 along the surface of the metal support plate 4. A top surface of the lower welding layer 75 is attached to a lower surface of the fourth bonding layer 6, and the lower welding layer 75 is connected to the metal support plate 4 through the fourth bonding layer 6. In this embodiment, the upper welding layer 73, the wrapping layer 74, and the lower welding layer 75 are formed by bending a same metal sheet.

The upper welding layer 73, the metal support plate 4, and the lower welding layer 75 are laminated, and the upper welding layer 73 and the lower welding layer 75 are a welding zone of the entire ground terminal. During practical use, when the ground terminal is welded on a circuit board 10, metal parts of the upper welding layer 73, the metal support plate 4, and the lower welding layer 75 form a molten pool 101. The molten pool 101 runs through the upper welding layer 73, the metal support plate 4, and the lower welding layer 75. A bottom end of the molten pool 101 is welded on the circuit board 10, and the molten pool 101 is basically composed of metal. When there is a current at the contact layer 71, the current can sequentially pass through the side layer 72, the upper welding layer 73, and the molten pool 101 from the contact layer 71, and finally reach the circuit board 10. When the molten pool 101 formed during welding cannot connect to the upper welding layer 73, the metal support plate 4, and the lower welding player 75 due to a welding error of the ground terminal, the current can also sequentially pass through the side layer 72, the upper welding layer 73, the wrapping layer 74, and the lower welding layer 75 from the contact layer 71, and finally reach the circuit board 10. When the upper welding layer 73 and the lower welding layer 75 are connected together by using the wrapping layer 74, the current can also flow through the wrapping layer 74, which is different from that when only the molten pool 101 is used for grounding. In this way, grounding paths of the ground terminal are increased, and redundancy of grounding performance of the ground terminal is improved.

In addition, since the upper welding layer 73 and the lower welding layer 75 are connected together through the wrapping layer 74 and are formed integrally, bonding area between the metal support plate 4 and the metal work piece 7 is doubled. This can prevent the upper welding layer 73 or the lower welding layer 75 from warping or misalignment due to high temperature or vibration during ultrasonic welding when the ground terminal is weld, and can also prevent the upper welding layer 73, the metal support plate 4, and the lower welding layer 75 from being separated each other due to insufficient adhesion between the third bonding layer 5 and the fourth bonding layer 6. In addition, compared with that a plastic plate such as a polyethylene terephthalate (PET) plate or a PI film 12 is used as a support plate of a traditional ground terminal, that the present disclosure uses the metal support plate 4 as a support plate of the ground terminal can ensure that no black point is generated during the welding, the molten pool 101 generated through the welding has good conductivity, and support is provided for the upper welding layer 73 and the lower welding layer 75. The black point may be formed due to high-temperature carbonization of a plastic sheet.

As shown in FIG. 1 and FIG. 2, in some embodiments, the ground terminal is left-right symmetrical, and the metal work piece 7 includes two side layers 72, two upper welding layers 73, two wrapping layers 74, and two lower welding layers 75. The two side layers 72, the two upper welding layers 73, the two wrapping layers 74, and the two lower welding layers 75 each are left-right symmetrical with respect to a center of the core body 1. The left-right symmetrical ground terminal is suitable for the circuit board 10 with a larger welding zone. With the two upper welding layers 73 and the two lower welding layers 75 for welding, there are more molten pools 101, the ground terminal can be better fixed on the circuit board 10, and the core body 1 located in the middle of the ground terminal can be more firmly fixed on the circuit board 10.

Figure 3:
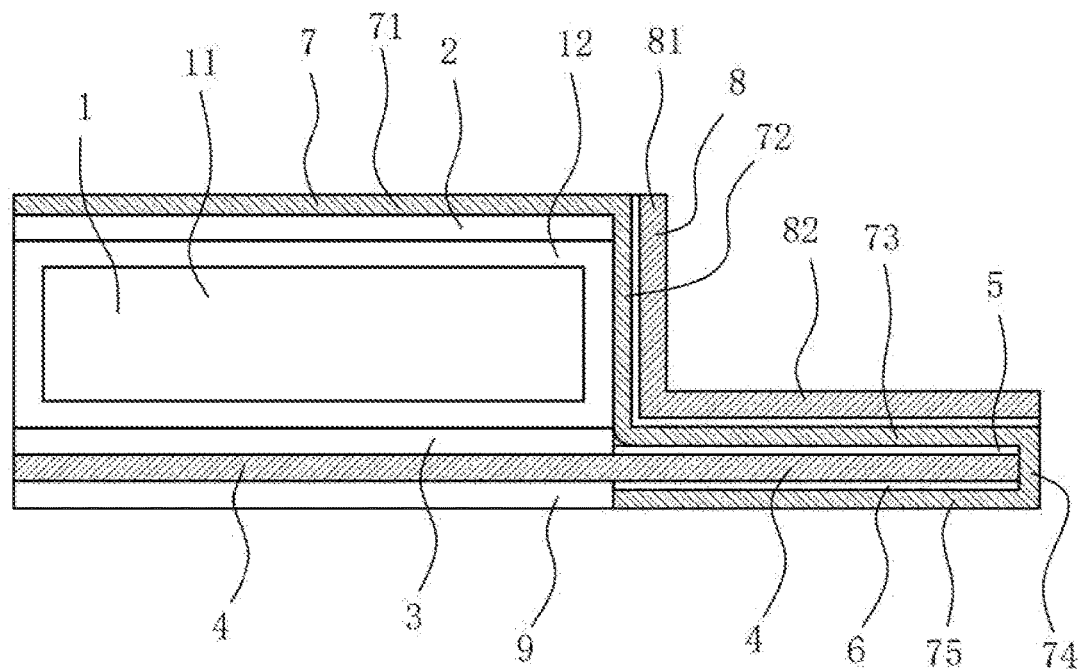
FIG. 3 is a schematic structural diagram of a P-shaped ground terminal according to an embodiment.

As shown in FIG. 3, in some embodiments, the ground terminal is of a P-shaped structure, and the metal work piece 7 includes one side layer 72, one upper welding layer 73, one wrapping layer 74, and one lower welding layer 75. A surface of the core body 1 facing away from the side layer 72 is exposed outside the metal work piece 7, and the surface of the core body 1 facing away from the side layer 72 is aligned up and down with one end of the metal support plate 4 facing away from a wrapping part. For the P-shaped ground terminal, because only one side of the core body 1 is wrapped by the side layer 72, the core body 1 is less limited by the metal work piece 7 and has larger activity space. This makes the core body 1 have stronger resilience and suitable for an application scenario in which the ground terminal needs to undergo significant deformation.

As shown in FIG. 1 and FIG. 2, the ground terminal 102 further includes an auxiliary metal plate 8. The auxiliary metal plate 8 includes an upper auxiliary layer 81 and a lower auxiliary layer 82. The upper auxiliary layer 81 is attached to the side layer 72, the upper auxiliary layer 81 extends from top to bottom, the lower auxiliary layer 82 extends from a bottom end of the upper auxiliary layer 81 to the wrapping layer 74 along the surface of the metal support plate 4, and the lower auxiliary layer 82 is attached to an upper surface of the upper welding layer 73. The auxiliary metal plate 8 is roughly L-shaped. In actual production, an included angle between the upper auxiliary layer 81 and the lower auxiliary layer 82 is an obtuse angle. The auxiliary metal plate 8 can reinforce the metal work piece, especially the junction between the side layer 72 and the upper welding layer 73, to prevent the junction between the side layer 72 and the upper welding layer 73 from being broken after the core body 1 is pressed a plurality of times, thereby prolonging a service life of the ground terminal. In addition, if the ground terminal 102 is welded on the circuit board 10 through the ultrasonic welding, the auxiliary metal plate 8 can also reinforce the junction between the side layer 72 and the upper welding layer 73 to prevent the junction between the side layer 72 and the upper welding layer 73 from being broken due to high-frequency vibration. In this embodiment, the auxiliary metal plate 8 is made of a copper foil.

In actual production, in order to prolong the service life of the ground terminal, a surface of the metal work piece 7 facing away from the core body 1 is usually gold-plated, and a thickness of a gold plating layer is generally greater than 10 nm. Oxidation resistance performance of gold is used to prevent oxidation of the ground terminal. However, due to a high surface reflectivity of the gold, it is not conducive to laser welding and recognition by a visual system. Therefore, in order to solve the problem of the high surface reflectivity of the gold, a surface of the auxiliary metal plate 8 facing away from the metal work piece 7 can also be nickel-plated or blackened, which is conducive to reducing a surface reflectivity of the auxiliary metal plate 8. When the upper welding layer 73 is weld through laser welding, the nickel-plated or blackened auxiliary metal plate 8 can effectively absorb laser and generate heat. In addition, the nickel-plated or blackened auxiliary metal plate 8 is darker in color compared with gold plating, which helps the visual system to perform capturing and facilitates automated welding. The auxiliary metal plate 8 has a thickness of 6-12 μm. Limiting the thickness of the auxiliary metal plate 8 to this range can ensure that the junction between the side layer 72 and the upper welding layer 73 can be fully reinforced without causing a significant negative impact on the resilience of the core body 1. In some embodiments, the surface of the metal work piece 7 facing away from the core body 1 may not be gold-plated but be nickel-plated, and a nickel layer is greater than 0.3 μm. For a nickel plating method of the metal work piece 7, the auxiliary metal plate 8 can still be reinforced by using an additional auxiliary metal plate 8, but a surface of the auxiliary metal plate 8 does not need to be nickel-plated or blackened.

In some embodiments, the ground terminal 102 further includes a base adhesive layer 9, and the base adhesive layer 9 is attached to a bottom surface of the metal support plate. A bottom surface of the base adhesive layer 9 may be flush with a bottom surface of the lower welding layer 75, or slightly protrude downwards from a bottom surface of the lower welding layer 75. The base adhesive layer 9 is used to fix the metal support plate 4 and the circuit board 10, to prevent the ground terminal from breaking away from the circuit board 10 after long-term use, and improve stability of the ground terminal when the ground terminal is welded on the circuit board 10. In addition, the base adhesive layer 9 can also be used to insulate the metal support plate 4 and the circuit board 10, to avoid interference from a plurality of conduction paths, such that the ground terminal only relies on conduction of the molten pool 101 and the wrapping layer 74. In this embodiment, the base adhesive layer 9 is made of the acrylic pressure-sensitive adhesive, and has a thickness of 6-30 μm. A 180-degree peeling force of the base adhesive layer 9 is greater than or equal to 500 gf/25 mm, and preferably, is greater than or equal to 800 gf/25 mm. In addition, in some embodiments, the bottom surface of the lower welding layer 75 may also be equipped with a tail adhesive layer. This can ensure that the lower welding layer 75 is bonded to the circuit board 10 to limit a position of the lower welding layer 75 when the ground terminal is weld on the circuit board 10. A thickness of the tail adhesive layer is less than or equal to 10 μm. Preferably, the thickness of the base adhesive layer 9 is less than or equal to 6 μm. In some embodiments, no base adhesive or blank may be provided below the metal support plate 4.

The core body 1 includes a foam 11 and the PI film 12. The foam 11 is made of high-resilience polyurethane or silicone. The PI film 12 wraps the foam 11, and a form of the foam 11 is fixed by the PI film 12 through thermal forming, to ensure complete fitting between the PI film 12 and the foam 11 and dimensional stability of the PI film 12 and the foam 11 in a compression rebounding process. The first bonding layer 2 and the second bonding layer 3 are attached to the PI film 12.

The metal work piece 7 has a thickness of 6-25 μm. Controlling the thickness of the metal work piece 7 to within 6-25 μm can ensure that the metal work piece 7 has sufficient strength and will not be fractured during the welding, without affecting elasticity of the core body 1.

The metal support plate 4 has a thickness of 35-50 μm. Controlling the thickness of the metal support plate 4 to within 35-50 μm can meet a reinforcement requirement of the metal support plate 4 for the metal work piece 7, and when the upper welding layer 73 is weld, can ensure the production of the molten pool 101 connecting the upper welding layer 73, the metal support plate 4, and the lower welding layer 75.

The third bonding layer 5 and the fourth bonding layer 6 each have a thickness of 3-6 μm. On a premise of ensuring that the upper welding layer 73 and the lower welding layer 75 are bonded with the metal support plate 4, controlling the thicknesses of the third bonding layer 5 and the fourth bonding layer 6 to within this range can ensure sufficient conductivity of the molten pool 101 generated through the welding, to prevent the molten pool 101 from being affected due to a too thick adhesive layer.

An electronic device includes a circuit board 10 and the ground terminal 102. The ground terminal 102 is welded on a surface of the circuit board 10 to form the molten pool 101, and the molten pool 101 runs through the upper welding layer 73, the metal support plate 4, and the lower welding layer 75 and is connected to the surface of the circuit board 10. A current may sequentially pass through the side layer 72, the upper welding layer 73, and the molten pool 101 from the contact layer 71, and then reach the circuit board 10, or may sequentially pass through the side layer 72, the upper welding layer 73, the wrapping layer 74, and the lower welding layer 75 from the contact layer 71, and finally reach the circuit board 10. The metal support plate 4 can support and reinforce the upper welding layer 73 and the lower welding layer 75. Even if the ground terminal 102 is pressed thousands of times, there will be no misalignment or warping between the upper welding layer 73, the lower welding layer 75, and the metal support plate 4.

A ground elastic terminal made using the manufacturing method described in the present disclosure is described in detail below with specific embodiments and comparative embodiments. The embodiments described below are merely used as examples, rather than limitations to the present disclosure.

Embodiment 1

This embodiment provides a ground terminal, including a core body 1, a metal support plate 4, and a metal work piece 7. The metal support plate 4 is located below the core body 1 and bonded with the core body 1. The metal work piece 7 extends downwards from a top end of the core body 1 along a surface of the core body 1, then extends to a surface of the metal support plate 4 and wraps an end portion of the metal support plate 4, and finally is attached to a bottom surface of the metal support plate 4.

Embodiment 2

This embodiment provides a ground terminal. Different from the ground terminal in Embodiment 1, the ground terminal in this embodiment is provided with an auxiliary metal plate 8. The auxiliary metal plate 8 is bonded to a side layer 72 and an upper welding layer 73.

Comparative Embodiment 1

Figure 4:
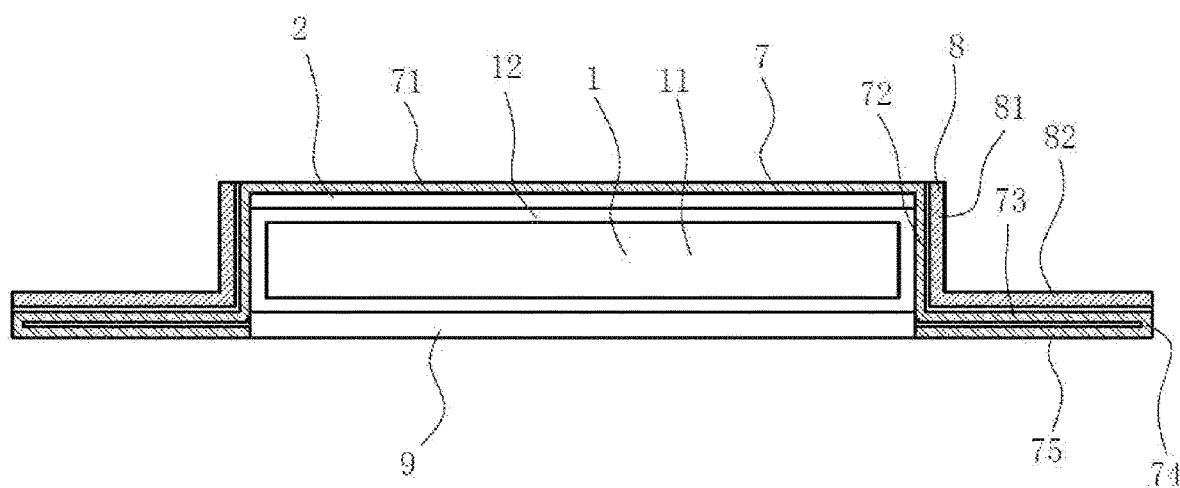
FIG. 4 is a schematic structural diagram according to Comparative Embodiment 1.

As shown in FIG. 4, this embodiment provides a ground terminal. Different from the ground terminal in Embodiment 1, the ground terminal in this embodiment is not provided with a metal support plate 4, and an upper welding layer 73 and a lower welding layer 75 are directly bonded and are connected as a whole through a wrapping layer 74.

Comparative Embodiment 2

Figure 5:
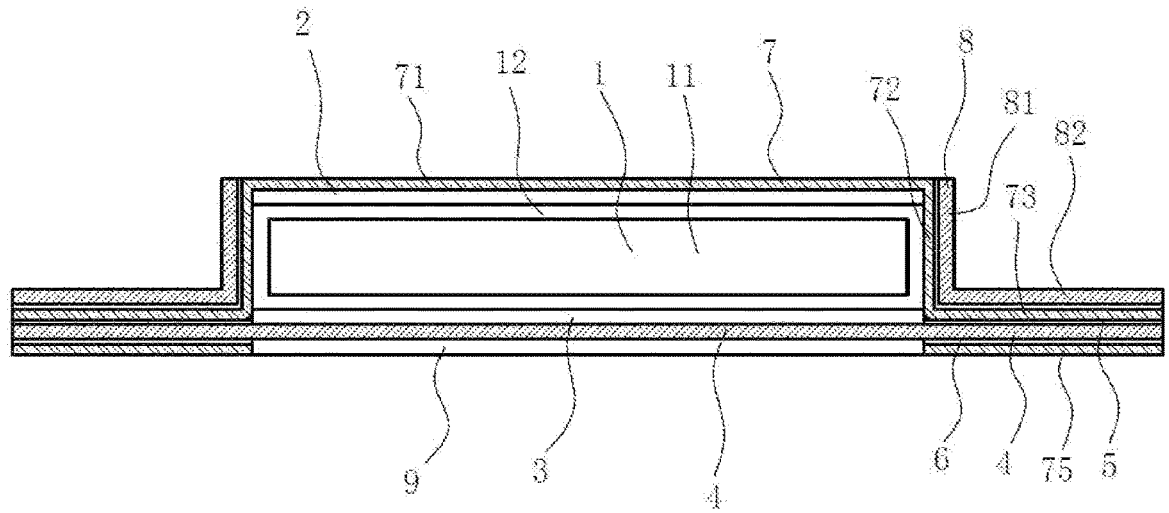
FIG. 5 is a schematic structural diagram according to Comparative Embodiment 2.

As shown in FIG. 5, this embodiment provides a ground terminal. Different from the ground terminal in Embodiment 1, the ground terminal in this embodiment is not provided with a wrapping layer 74, and an end portion of a metal support plate 4 is exposed.

Comparative Embodiment 3

Figure 6:
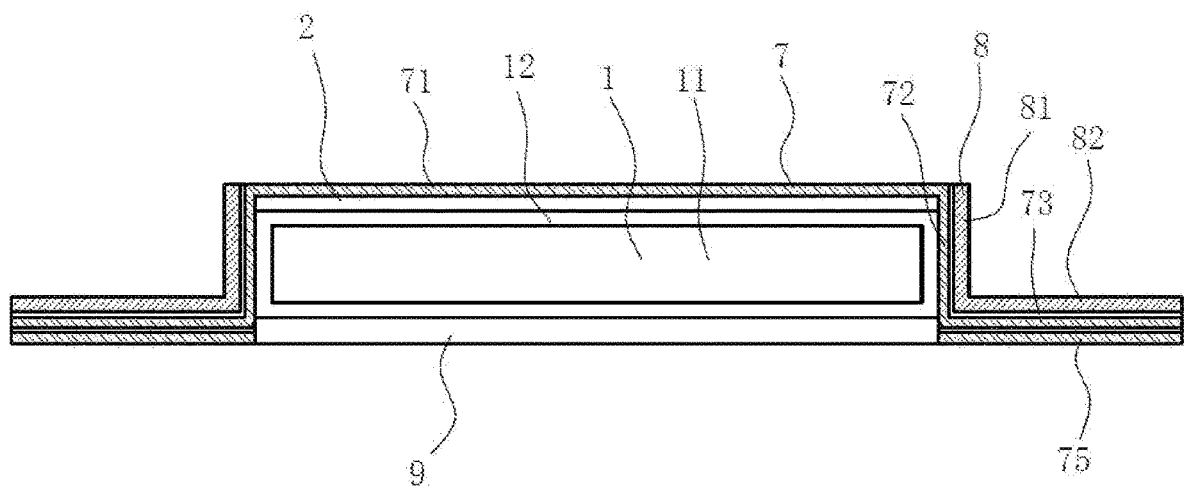
FIG. 6 is a schematic structural diagram according to Comparative Embodiment 3.

As shown in FIG. 6, this embodiment provides a ground terminal. Different from the ground terminal in Embodiment 1, the ground terminal in this embodiment is not provided with a metal support plate 4, an upper welding layer 73 and a lower welding layer 75 are directly bonded, and no wrapping layer 74 is provided to connect the upper welding layer 73 and the lower welding layer 75 together.

Following performance tests are conducted for Embodiment 1, Embodiment 2, and Comparative Embodiment 1 to Comparative Embodiment 3.

1. Press test. A key life test machine with a model of DK-5017 is used to conduct a press test on the ground terminal. After the ground terminal is pressed 100 times by using a force of a 300 g dead weight, the terminal is removed by using tweezers, and a condition of the ground terminal is observed with a naked eye.
2. Resistance test. The resistance test is to detect contact resistance of the ground terminal. The contact resistance is resistance between the ground terminal and the circuit board 10 after the ground terminal is welded on the circuit board 10. Smaller contact resistance leads to a better conductivity effect of the ground terminal, in other words, a better grounding or signal interference elimination capability of the ground terminal, which can be determined by using the resistance test. The resistance test of the ground terminal in the present disclosure is to determine whether the ground terminal still meets a usage requirement after a certain quantity of press tests. If the contact resistance is smaller than 0.3Ω, it is considered that the contact resistance can meet the usage requirement.
3. Drawing force test. A 9628B adhesive tape is tailored based on a width of 2.5 mm, and then a tailored 9628B tape is attached to the metal work piece 7 close to one side of the core body. Then, a tensile machine is used to pull the 9628B adhesive tape upward with a force perpendicular to a surface of the circuit board. As the tensile machine rises, a connection point between the metal work piece 7 wrapping the core body and the metal work piece 7 welded on the circuit board will be pulled apart, and a size of the force when the connection point is pulled apart is recorded. 5 to 10 samples are usually used, or a specific sample quantity is adjusted based on a test requirement.

Relevant tests are conducted for the grounding elastic terminals in the above embodiments and comparative embodiments, and specific test results are shown in Table 1.

TABLE 1

| Control group | Quantity of press tests after which a problem such as misalignment or lateral fracture occurs | Contact resistance (ohm) | Drawing force test (N) |
|---|---|---|---|
| Embodiment 1 | 2000 | <0.05 | >2 |
| Embodiment 2 | >3000 | <0.05 | >2.5 |
| Comparative Embodiment 1 | 1000 | >10 | <0.50 |
| Comparative Embodiment 2 | 500 | <0.05 | 1.5 |
| Comparative Embodiment 3 | <500 | >10 | <0.50 |

The following can be found based on Embodiment 1 and Comparative Embodiment 1 to Comparative Embodiment 3.

Compared with the ground terminals in Comparative Embodiment 1 to Comparative Embodiment 3, the ground terminal in Embodiment 1 has a longer service life. For the ground terminal in Embodiment 1, after 2,000 press tests, there is still no misalignment between the core body 1 and the metal work piece 7, and there is no misalignment between the upper welding layer 73, the lower welding layer 75, and the metal support plate 4. The upper welding layer 73 and the lower welding layer 75 are not fractured either. The contact resistance is still less than 0.05 ohms, and good conductivity is achieved, meeting a normal usage requirement. For the ground terminal in Comparative Embodiment 1, after 1,000 presses, the core body 1 and the metal work piece 7 are misaligned, and the molten pool 101 cannot be formed during welding because the upper welding layer 73 and the lower welding layer 75 are burned through. After the resistance test, the contact resistance is greater than 10 ohms, and the drawing force is less than 0.50 N. For the ground terminal in Comparative Embodiment 2, after 500 presses, the upper contact layer 71 and the metal support plate 4 are misaligned and separated, and the structure is disassembled. After the resistance test, the contact resistance is less than 0.05 ohms, and the drawing force is 1.5 N. For the ground terminal in Comparative Embodiment 3, after 500 presses, the upper contact layer 71 and the metal support plate 4 are misaligned and separated. As a result, the structure is disassembled, fractured, or not rebounded, and the metal work piece 7 is in a crushing state. In addition, for the ground terminal in Comparative Embodiment 3, the molten pool 101 cannot be formed during welding because the upper welding layer 73 and the lower welding layer 75 are burned through. After the resistance test, the contact resistance is greater than 10 ohms, and the drawing force is also less than 0.50 N.

The following can be found based on Embodiment 1 and Embodiment 2.

Compared with the ground terminal in Embodiment 1, the ground terminal in Embodiment 2 has a significantly stronger anti-pressure capability, a longer service life, a greater drawing force, and higher strength.

To sum up, the embodiments of the present disclosure provide a ground terminal and an electronic device. A metal support plate 4 is disposed below a core body 1, an end portion of the metal support plate 4 is wrapped by a wrapping layer 74, and the wrapping layer 74 connects an upper welding layer 73 and a lower welding layer 75 into a whole, such that a structure between a metal working layer and the metal support plate 4 is stable. During welding, a molten pool 101 can be generated normally, and even after being pressed thousands of times, the metal working layer and the metal support plate 4 are neither warped or misaligned with each other, nor fractured.

The above are only preferred implementations of the present disclosure. It should be noted that several improvements and replacements may further be made by a person of ordinary skill in the art without departing from the principle of the present disclosure, and such improvements and replacements should also be deemed as falling within the protection scope of the present disclosure.

The invention claimed is:

1. A ground terminal, comprising:
    a core body;
    a first bonding layer attached to an upper surface of the core body;
    a second bonding layer attached to a lower surface of the core body;
    a metal support plate located below the core body and attached to the second bonding layer;
    a third bonding layer attached to an upper surface of the metal support plate;
    a fourth bonding layer attached to a lower surface of the metal support plate; and
    a metal work piece comprising a contact layer, a side layer, an upper welding layer, a wrapping layer, and a lower welding layer, wherein the contact layer is attached to an upper surface of the first bonding layer, the side layer is located on one side of the core body and extends downwards from one end of the contact layer, the upper welding layer is connected to the metal support plate through the third bonding layer and extends from a bottom end of the side layer to one end of the metal support plate along a surface of the metal support plate, the wrapping layer wraps an end portion of the metal support plate, the upper welding layer is connected to a top end of the wrapping layer, the lower welding layer extends from a bottom end of the wrapping layer to the core body along the surface of the metal support plate, and the lower welding layer is connected to the metal support plate through the fourth bonding layer.

2. The ground terminal according to claim 1, wherein there are two side layers, two upper welding layers, two wrapping layers, and two lower welding layers, and the two side layers, the two upper welding layers, the two wrapping layers, and the two lower welding layers each are left-right symmetrical with respect to a center of the core body.

3. The ground terminal according to claim 1, wherein a surface of the core body facing away from the side layer is exposed outside the metal work piece.

4. The ground terminal according to claim 1, further comprising an auxiliary metal plate, wherein the auxiliary metal plate comprises an upper auxiliary layer and a lower auxiliary layer, the upper auxiliary layer is attached to the side layer, the upper auxiliary layer extends from top to bottom, the lower auxiliary layer extends from a bottom end of the upper auxiliary layer to the wrapping layer along the surface of the metal support plate, and the lower auxiliary layer is attached to an upper surface of the upper welding layer.

5. The ground terminal according to claim 4, wherein a surface of the auxiliary metal plate facing away from the metal work piece is nickel-plated or blackened.

6. The ground terminal according to claim 4, wherein the auxiliary metal plate has a thickness of 6-12 µm.

7. The ground terminal according to claim 1, further comprising a base adhesive layer, wherein the base adhesive layer is attached to a bottom surface of the metal support plate.

8. The ground terminal according to claim 1, wherein the core body comprises a foam and a polyimide (PI) film, the PI film wraps the foam, and the first bonding layer and the second bonding layer are attached to the PI film.

9. The ground terminal according to claim 1, wherein the metal work piece has a thickness of 6-25 µm.

10. The ground terminal according to claim 1, wherein the metal support plate has a thickness of 35-50 µm.

11. The ground terminal according to claim 1, wherein the third bonding layer and the fourth bonding layer each have a thickness of 3-6 µm.

12. An electronic device, comprising a circuit board and the ground terminal according to claim 1, wherein the ground terminal is welded on a surface of the circuit board to form a molten pool, and the molten pool runs through the upper welding layer, the metal support plate, and the lower welding layer and is connected to the surface of the circuit board.

13. An electronic device, comprising a circuit board and the ground terminal according to claim 2, wherein the ground terminal is welded on a surface of the circuit board to form a molten pool, and the molten pool runs through the upper welding layer, the metal support plate, and the lower welding layer and is connected to the surface of the circuit board.

14. An electronic device, comprising a circuit board and the ground terminal according to claim 3, wherein the ground terminal is welded on a surface of the circuit board to form a molten pool, and the molten pool runs through the upper welding layer, the metal support plate, and the lower welding layer and is connected to the surface of the circuit board.

15. An electronic device, comprising a circuit board and the ground terminal according to claim 4, wherein the ground terminal is welded on a surface of the circuit board to form a molten pool, and the molten pool runs through the upper welding layer, the metal support plate, and the lower welding layer and is connected to the surface of the circuit board.

16. An electronic device, comprising a circuit board and the ground terminal according to claim 5, wherein the ground terminal is welded on a surface of the circuit board to form a molten pool, and the molten pool runs through the upper welding layer, the metal support plate, and the lower welding layer and is connected to the surface of the circuit board.

17. An electronic device, comprising a circuit board and the ground terminal according to claim 6, wherein the ground terminal is welded on a surface of the circuit board to form a molten pool, and the molten pool runs through the upper welding layer, the metal support plate, and the lower welding layer and is connected to the surface of the circuit board.

18. An electronic device, comprising a circuit board and the ground terminal according to claim 7, wherein the ground terminal is welded on a surface of the circuit board to form a molten pool, and the molten pool runs through the upper welding layer, the metal support plate, and the lower welding layer and is connected to the surface of the circuit board.

19. An electronic device, comprising a circuit board and the ground terminal according to claim 8, wherein the ground terminal is welded on a surface of the circuit board to form a molten pool, and the molten pool runs through the upper welding layer, the metal support plate, and the lower welding layer and is connected to the surface of the circuit board.

20. An electronic device, comprising a circuit board and the ground terminal according to claim 9, wherein the ground terminal is welded on a surface of the circuit board to form a molten pool, and the molten pool runs through the upper welding layer, the metal support plate, and the lower welding layer and is connected to the surface of the circuit board.

* * * * *